(12) United States Patent
Dijk

(10) Patent No.: US 8,797,699 B2
(45) Date of Patent: Aug. 5, 2014

(54) MEDIUM-VOLTAGE DRIVERS IN A SAFETY APPLICATION

(75) Inventor: Luc van Dijk, Nijmegen (NL)

(73) Assignee: NXP B.V., Eindhoven (NL)

( * ) Notice: Subject to any disclaimer, the term of this patent is extended or adjusted under 35 U.S.C. 154(b) by 36 days.

(21) Appl. No.: 13/598,700

(22) Filed: Aug. 30, 2012

(65) Prior Publication Data

US 2014/0062194 A1    Mar. 6, 2014

(51) Int. Cl.
*H02H 3/20* (2006.01)

(52) U.S. Cl.
USPC .......................................... 361/91.1

(58) Field of Classification Search
USPC .......................................... 361/91.1
See application file for complete search history.

(56) References Cited

U.S. PATENT DOCUMENTS

| | | | |
|---|---|---|---|
| 5,939,908 A | 8/1999 | Moore et al. | |
| 7,719,055 B1* | 5/2010 | McNutt et al. | 257/341 |
| 2010/0295383 A1 | 11/2010 | Cummings | |
| 2011/0251757 A1* | 10/2011 | Fey et al. | 701/37 |
| 2012/0146524 A1* | 6/2012 | Jeong | 315/193 |
| 2013/0249514 A1* | 9/2013 | Huang et al. | 323/282 |
| 2014/0062194 A1* | 3/2014 | Dijk | 307/38 |

FOREIGN PATENT DOCUMENTS

| CN | 201674472 | 12/2010 |
|---|---|---|
| WO | WO-2007/051777 | 5/2007 |

OTHER PUBLICATIONS

Extended European Search Report dated Oct. 22, 2013, related to a counter part application No. EP 13178887.9.

* cited by examiner

*Primary Examiner* — Ronald W Leja

(57) ABSTRACT

Various exemplary embodiments relate to a current driver for controlling a safety control device, including: a clamp circuit connected to a first output configured to clamp the voltage at the first output to a clamp voltage value, wherein the first output is configured to be connected to a high voltage switch; a plurality of medium voltage switches; a plurality of switch drivers, wherein each switch driver is connected to one of the medium voltage switches; a plurality of second outputs wherein each of the plurality of second outputs are configured to be connected across one of a plurality of loads; and a controller configured to control the high voltage switch.

18 Claims, 4 Drawing Sheets

MEDIUM-VOLTAGE DRIVERS IN A SAFETY APPLICATION

TECHNICAL FIELD

Various exemplary embodiments disclosed herein relate generally to medium-voltage drivers in safety applications.

BACKGROUND

In safety applications (automobiles are one example), a number of loads may be switched on and off by a corresponding switch. In addition, there may be a common ("central") switch that allows power to be supplied to all loads. In today's applications, the switches are all high-voltage devices, which implies high-cost (because large silicon area is required for the realization of the switches). Accordingly there remains a need to improve upon today's applications in order to reduce cost and/or size.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to current driver for controlling a safety control device, including: a clamp circuit connected to a first output configured to clamp the voltage at the first output to a clamp voltage value, wherein the first output is configured to be connected to a high voltage switch; a plurality of medium voltage switches; a plurality of switch drivers, wherein each switch driver is connected to one of the medium voltage switches; a plurality of second outputs wherein each of the plurality of second outputs are configured to be connected across one of a plurality of loads; and a controller configured to control the high voltage switch.

Various exemplary embodiments relate to a method of controlling a maximum voltage applied to loads, including: controlling the state of a high voltage switch; controlling the state of a plurality of medium voltage switches wherein the medium voltage switches have an associated load; detecting an over voltage situation; and clamping the voltage at the high voltage switch to a clamp voltage value.

Various exemplary embodiments relate to a safety control device, including: a clamp circuit connected to a first output configured to clamp the voltage at the first output to a clamp voltage value, wherein the first output is configured to be connected to a high voltage switch; a plurality of second outputs wherein each of the plurality of second outputs are configured to be connected to one of a plurality of medium voltage switches and its associated load; a plurality of switch drivers each connected to one of the plurality of second outputs, wherein each switch driver is configured to be connected to one of the medium voltage switches; and a controller configured to control the high voltage switch.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
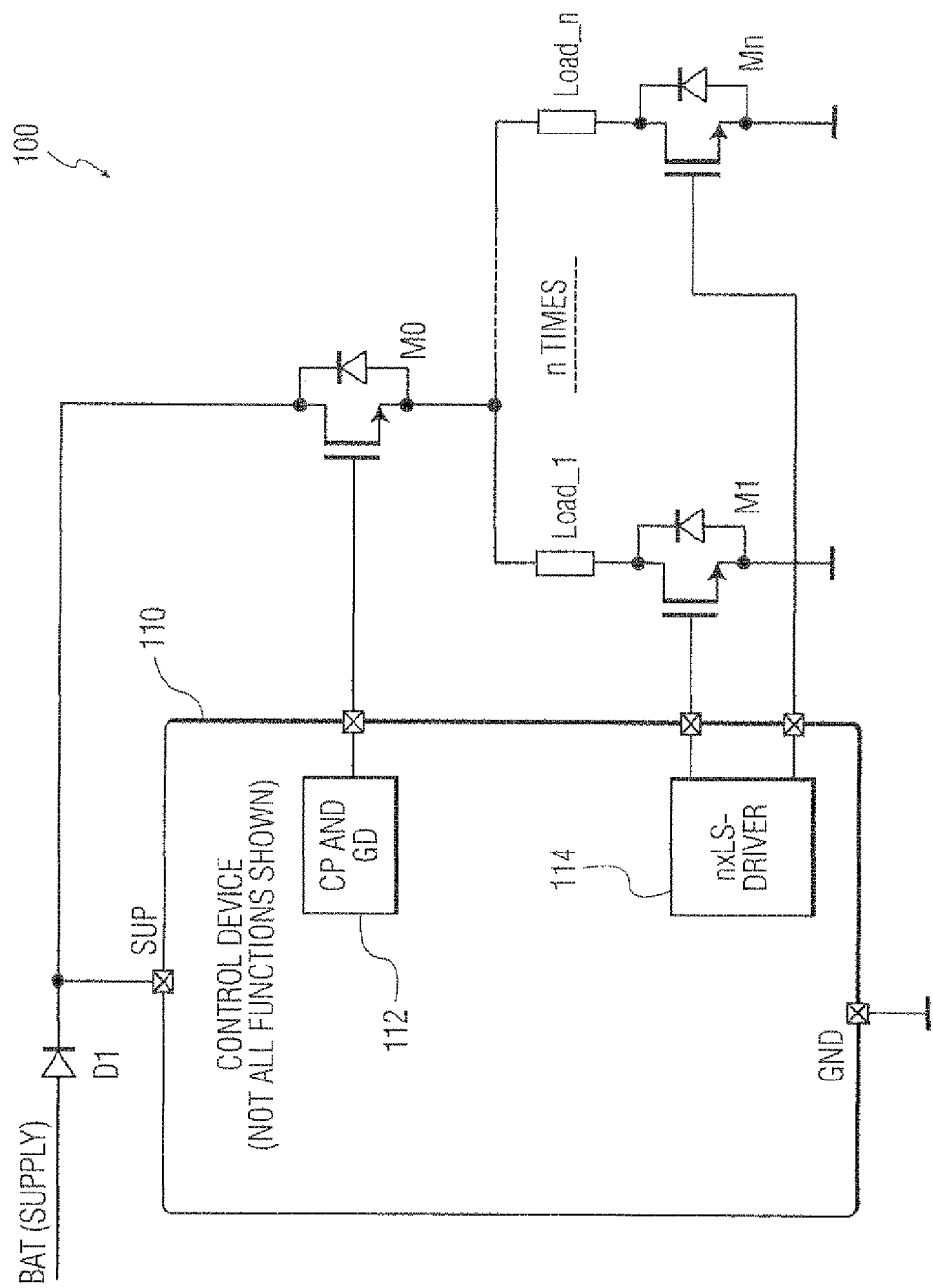
FIG. 1 illustrates a related art load protection system.

FIG. 1 illustrates a related art load protection system. Such load protections systems 100 may be found in various applications and systems. The load protection system may include a control device 110, a high power switch M0, a plurality of loads Load_1 to Load_n, and plurality of high voltage switches M1 to Mn.

The high voltage switch M0 may be connected to a power source such as a battery. A diode D1 may be included to ensure that current does not flow between BAT and GND terminals when the Battery is connected with wrong polarity to these terminals.

The loads Load_1 to Load_n are connected to the high power switch M0. The loads Load_1 to Load_n are substantially parallel to one another. Each of the loads Load_1 to Load_n are then connected to their respective high voltage switches M1 to Mn. The high voltage switches M1 to Mn may then be connected to ground.

The control device 110 may include a controller 112 and a plurality of low side drivers (LS-drivers) 114. The controller 112 may detect problems in the system that require power to be removed from the system. The controller may include a gate driver (GD) and a change prep (CP). When the controller 112 senses such problem, it opens the switch M0 to remove power from the loads Load_1 to Load_n. The LS-drivers 114 each may be connected to one of the high power switches M1 to Mn. The LS-drivers 114 may control the high power switches M1 to Mn to turn power on and off to the loads Load_1 to Load_n.

The switches M0 to Mn may be operated in the linear region, i.e., the transistors may operate as a switch. This may be done for power dissipation reasons, because if one or more switches do not operate in the linear region, too much power dissipation in the switches may cause thermal issues in the application or worst case even destroy the switches.

A problem arises with the related art protection system. For example in automotive applications, the supply voltage may reach high-levels (up to 40V in automotive). Because of this all switches M0 to Mn need to be realized with devices that can withstand at least 40V. This makes the switches M0 to Mn expensive.

Figure 2:
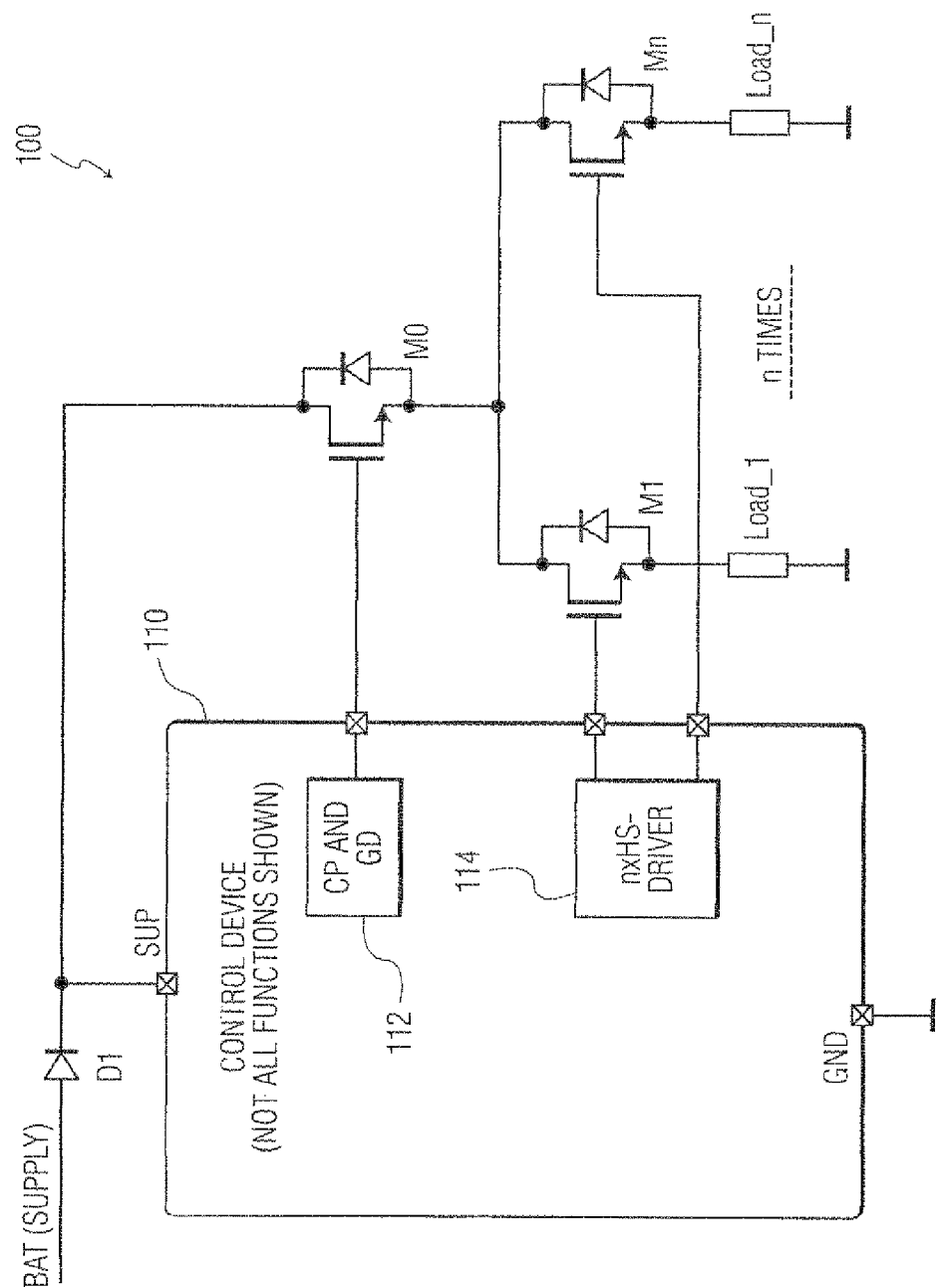
FIG. 2 illustrates another related art load protection system.

FIG. 2 illustrates another related art load protection system. The difference between FIG. 1 and FIG. 2 is the relative location of the loads Load_1 to Load_n and switches M1 to Mn to one another. In FIG. 1, the loads Load_1 to Load_n are in between switch M0 and switches M1 to Mn. In FIG. 2, the loads Load_1 to Load_n are in between the switches M1 to Mn and ground. The LS-drivers in FIG. 1 become instead high side drivers (HS-drivers) in FIG. 2. The embodiment of FIG. 2 is less common and more expensive, but it does have the benefit of being able to control for individual load ground shorts. Otherwise the embodiment of FIG. 2 has the same elements and functions the same as the embodiment in FIG. 1.

A solution to the problem described above involves operating the central switch M0 in a linear mode when the operating voltage is below a specified operating value, and when the operating voltage is above the specified operating value, operating the switch in a saturation mode and clamping the gate voltage of the central switch M0 to a clamping voltage. In automotive application, the specified operating value may be about 18V and the clamping voltage may be about 29 V. Various other values may be used depending up the specified system and its requirements and operating environment. Thermal issues may not occur because the switch does not carry current when the supply voltage is higher than the operating voltage range.

Figure 3:
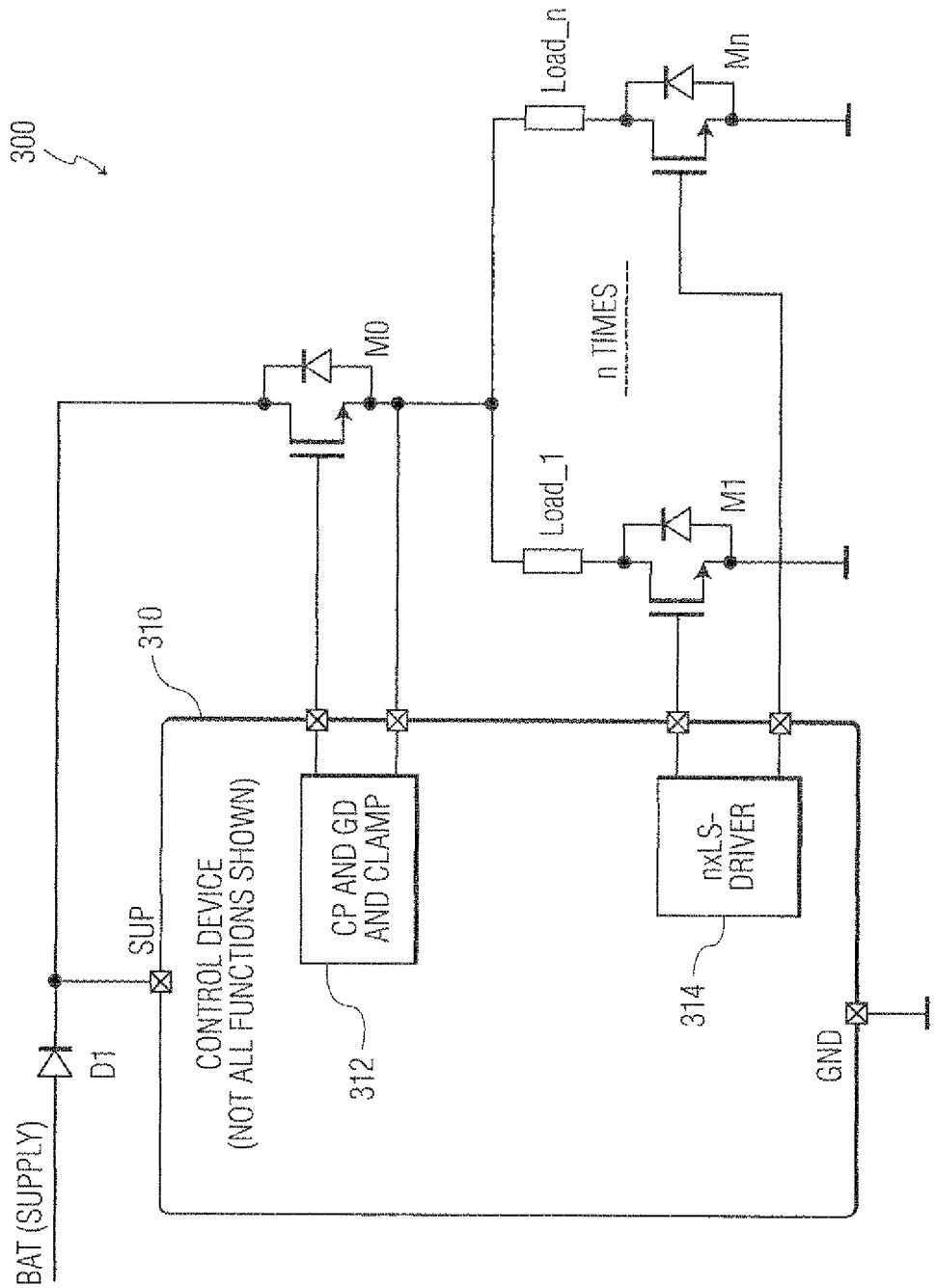
FIG. 3 illustrates an embodiment of a load protection system.

FIG. 3 illustrates an embodiment of a load protection system. The load protection system may include a control device 310, a high power switch M0, a plurality of loads Load_1 to Load_n, and plurality of medium voltage switches M1 to Mn.

The high voltage switch M0 may be connected to a power source such as a battery. A diode D1 may be present to ensure that current does not flow back into the battery.

The loads Load_1 to Load_n are connected to the high power switch M0. The loads Load_1 to Load_n are substantially parallel to one another. Each of the loads Load_1 to Load_n are then connected to their respective medium voltage switches M1 to Mn. The medium voltage switches M1 to Mn may then be connected to ground.

The control device 310 may include a controller 312 and a plurality of LS-drivers 314. The controller 312 may detect problems in the system that require power to be removed from the system. When the controller 312 senses such a problem, it opens the switch M0 to remove power from the loads Load_1 to Load_n. Further, the controller 312 may include a clamp circuit. The clamp circuit may clamp the voltage through the high power switch M0 to a clamping voltage. The clamp circuit will be described further below. The LS-drivers 314 each may be connected to one of the medium power switches M1 to Mn. The LS-drivers 314 may control the medium power switches M1 to Mn to turn power on and off to the loads Load_1 to Load_n.

Because the clamp circuit will reduce the maximum voltage seen by the medium voltage switch M1 to Mn, the medium voltage switches may be designed to accommodate a lower applied voltage. This has the advantage of being lower cost and allowing for smaller switching devices.

Figure 4:
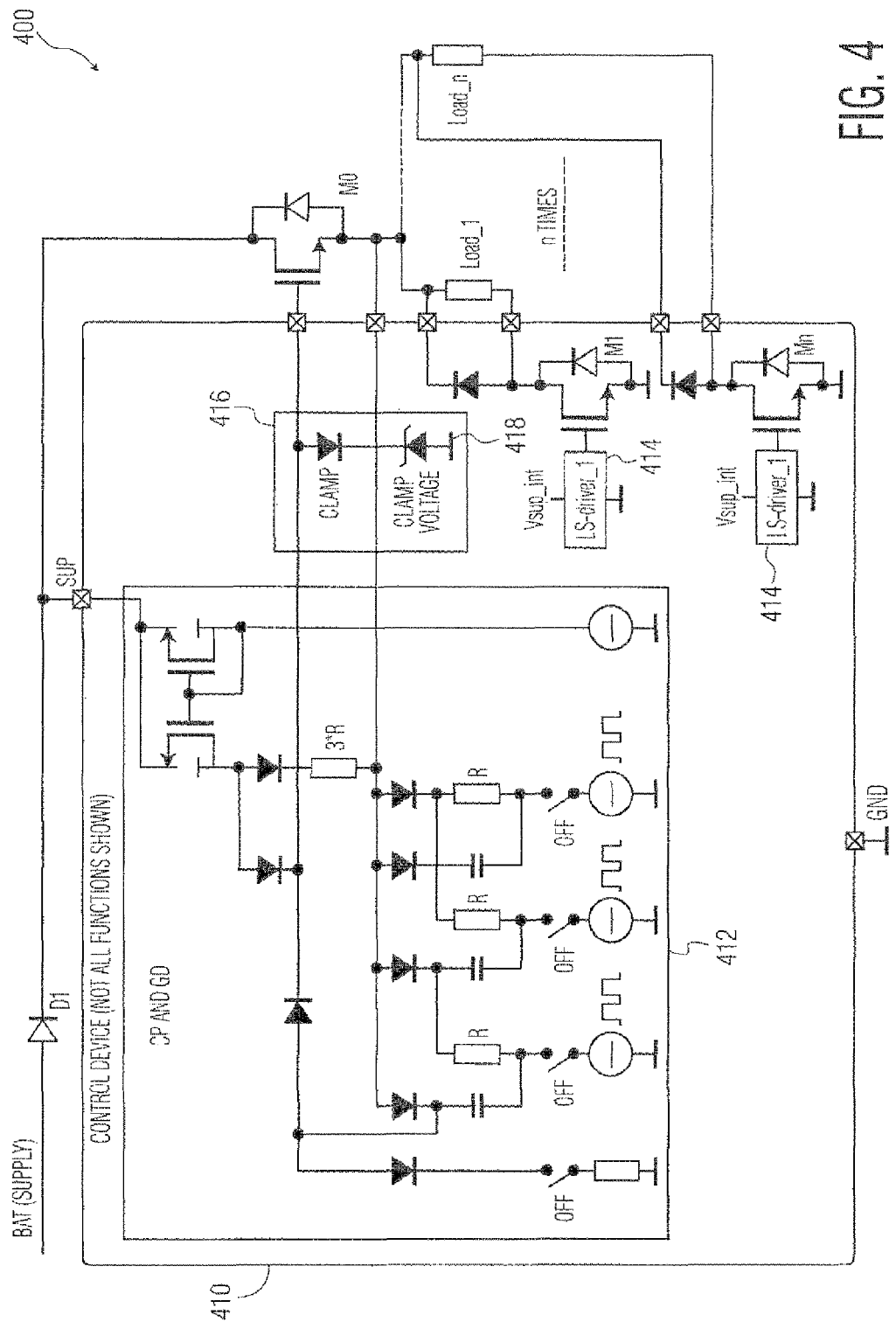
FIG. 4 illustrates another embodiment of a load protection system.

FIG. 4 illustrates another embodiment of a load protection system. The load protection system may include a control device 410, a high power switch M0, and a plurality of loads Load_1 to Load_n.

The high voltage switch M0 may be connected to a power source such as a battery. A diode D1 may be included to ensure that current does not flow between BAT and GND terminals when the Battery is connected with wrong polarity to these terminals.

The loads Load_1 to Load_n are connected to the high power switch M0. The loads Load_1 to Load_n are substantially parallel to one another. Each of the loads Load_1 to Load_n are then connected to their respective medium voltage switches M1 to Mn. The medium voltage switches M1 to Mn may then be connected to ground. In this embodiment the medium voltage switches M1 to Mn may be implemented in the control device 410.

The control device 410 may include a controller 412, a plurality of LS-drivers 414, a clamp circuit 416, and a plurality of medium voltage switches M1 to Mn. The controller 412 may detect problems in the system that require power to be removed from the system. When the controller 412 senses such a problem, it opens the switch M0 to remove power from the loads Load_1 to Load_n. Further, the controller 412 may include a clamp circuit 416. The clamp circuit 416 may clamp the voltage through the high power switch M0 to a clamping voltage. The clamp circuit may include a zener diode 418 with a breakdown voltage, while the clamp voltage becomes the breakdown voltage plus the forward voltage of a diode. The clamp circuit 416 may also be any other type of clamp circuit that is capable of clamping the voltage to a desired clamp voltage.

The LS-drivers 414 each may be connected to one of the medium power switches M1 to Mn. The LS-drivers 414 may control the medium power switches M1 to Mn to turn power on and off to the loads Load_1 to Load_n. In this case, the medium power switches M1 to Mn are shown as part of the control device. This may now be possible because the use of medium voltage switches M1 to Mn reasonably allows for the switches to be implemented in the control device. Further, the control device may have diodes across the outputs of the control device that are connected to the loads Load_1 to Load_n.

While the switches M0 to Mn are all depicted as NMOS devices, which is the most common implementation, other device types such as PMOS or bipolar switches may be used as well.

The control device 310 and 410 may be implemented on a single integrated circuit (IC). Further, in the description above, specific voltage values were described. Other values may be used as well. The relationship between the high voltage and the medium voltage may be such that they lead to significant differences in the design of the high voltage switch M0 versus the medium voltage switches M1 to Mn. The use of medium voltage switches M1 to Mn leads to greatly reduced cost and size of the devices. Further, it may lead to the medium voltage switches M1 to Mn being implemented in the control device and implemented on a single IC.

The load protection system may be used in automotive application areas, for example, antilock braking system, electronic stability program, electronic power steering, electronic parking brake, etc. Further, the load protection system may be applied in other systems that require load and safety protection.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a tangible and non-transitory machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A safety control device, comprising:
   a clamp circuit connected to a first output configured to clamp a voltage at the first output to a clamp voltage value, wherein the first output is configured to be connected to a high voltage switch;
   a plurality of medium voltage switches;
   a plurality of switch drivers, wherein each switch driver is connected to one of the plurality of medium voltage switches;
   a plurality of second outputs, wherein each of the plurality of second outputs is configured to be connected across one of a plurality of loads; and
   a controller configured to control the high voltage switch.

2. The control device of claim 1, wherein the clamp voltage value is 29V.

3. The control device of claim 1, further comprising:
   a plurality of diodes, wherein each diode is connected across one of the plurality of second outputs.

4. The control device of claim 3, wherein each of the plurality of switch drivers is connected to a gate of its associated medium voltage switch.

5. The control device of claim 4, wherein each of the plurality of medium voltage switches is attached to its associated diode and second output.

6. The control device of claim 1, wherein the clamp circuit includes a zener diode.

7. The control device of claim 6, wherein the zener diode has a breakdown voltage corresponding to the clamp voltage value.

8. The control device of claim 1, wherein the safety control device is an integrated circuit.

9. The control device of claim 1, wherein the controller is connected to the clamp circuit.

10. A safety control device, comprising:
    a clamp circuit connected to a first output configured to clamp a voltage at the first output to a clamp voltage value, wherein the first output is configured to be connected to a high voltage switch;
    a plurality of second outputs, wherein each of the plurality of second outputs is configured to be connected to one of a plurality of medium voltage switches and its associated load;
    a plurality of switch drivers each connected to one of the plurality of second outputs, wherein each switch driver is configured to be connected to one of the medium voltage switches; and
    a controller configured to control the high voltage switch.

11. The control device of claim 10, wherein each of the plurality of switch drivers is configured to be connected to a gate of its associated medium voltage switch.

12. The control device of claim 10, wherein the clamp voltage value is 29V.

13. The control device of claim 10, wherein the clamp circuit includes a zener diode.

14. The control device of claim 10, wherein the zener diode has a breakdown voltage corresponding to the clamp voltage value.

15. The control device of claim 10, wherein the safety control device is an integrated circuit.

16. The control device of claim 10, wherein the controller is connected to the clamp circuit.

17. A method of controlling a maximum voltage applied to loads, comprising:
    controlling a state of a high voltage switch;
    controlling a state of a plurality of medium voltage switches, wherein the medium voltage switches have an associated load;
    detecting an over voltage situation; and
    clamping a voltage at the high voltage switch to a clamp voltage value.

18. The method of claim 17, wherein the clamp voltage value is 29V.

* * * * *